(12) United States Patent
Pan (10) Patent No.: US 11,995,543 B2
(45) Date of Patent: May 28, 2024

(54) WAFER PROCESSING METHOD AND APPARATUS, STORAGE MEDIUM AND ELECTRONIC DEVICE (71) Applicant: Changxin Memory Technologies, Inc., Anhui (CN)

(72) Inventor: Xiaodong Pan, Hefei (CN)

(73) Assignee: Changxin Memory Technologies, Inc., Hefei (CN)

(*) Notice: Subject to any disclaimer, the term of this patent is extended or adjusted under 35 U.S.C. 154(b) by 589 days.

(21) Appl. No.: 17/212,912

(22) Filed: Mar. 25, 2021

(65) Prior Publication Data
US 2021/0209749 A1 Jul. 8, 2021

Related U.S. Application Data (63) Continuation of application No. PCT/CN2019/108058, filed on Sep. 26, 2019.

(30) Foreign Application Priority Data

Sep. 29, 2018 (CN) .......................... 201811149380.X (51) Int. Cl.
*G06T 7/00* (2017.01)
*G01R 31/3185* (2006.01)
(Continued)

(52) U.S. Cl.
CPC ....... *G06N 3/08* (2013.01); *G01R 31/318511* (2013.01); *G06T 7/0004* (2013.01);
(Continued)

(58) Field of Classification Search
CPC . G06T 7/0002–001; G06T 2207/30148; G06T 2207/20081; G06T 2207/20084;
(Continued)

(56) References Cited

U.S. PATENT DOCUMENTS

2007/0211932 A1* 9/2007 Lee .................. G06T 7/0004
382/145
2017/0140524 A1 5/2017 Karsenti et al.
2018/0330493 A1* 11/2018 Milligan ................ G06N 3/088

FOREIGN PATENT DOCUMENTS

CN 103367188 A 10/2013
CN 104008550 A 8/2014
(Continued)

OTHER PUBLICATIONS

Smith, Greg, et al. "Yield considerations in the choice of 3D technology." 2007 International Symposium on Semiconductor Manufacturing. IEEE, 2007. (Year: 2007).*
(Continued)

*Primary Examiner* — Geoffrey E Summers
(74) *Attorney, Agent, or Firm* — Sheppard Mullin Richter & Hampton LLP (57) ABSTRACT

A wafer processing method and apparatus, a storage medium and an electronic device are disclosed, relating to the field of integrated circuit (IC) manufacturing and wafer stacking. The wafer processing method includes: partitioning a target wafer into one or more pre-divided areas each having one or more dies; determining area ratings for each pre-divided area based on test data of the dies in each pre-divided area; and feeding the area ratings of the pre-divided areas to a trained classification model to determine a classification category of the target wafer; identifying a second wafer
(Continued)

having a same classification category as the target wafer; and stacking the target wafer with the second wafer. This method improves the production yield of stacked ICs.

20 Claims, 7 Drawing Sheets

(51) Int. Cl.
  *G06N 3/08* (2023.01)
  *G06V 10/82* (2022.01)
(52) U.S. Cl.
  CPC .... *G06V 10/82* (2022.01); *G06T 2207/20084* (2013.01); *G06T 2207/30148* (2013.01)
(58) Field of Classification Search
  CPC ................................ G06T 2207/20021; G01R 31/318505–318513; G06V 10/82; G06N 3/02–0985
  See application file for complete search history.

(56) References Cited

FOREIGN PATENT DOCUMENTS

| CN | 105203941 A | 12/2015 |
| CN | 105990170 A | 10/2016 |
| CN | 105990171 A | 10/2016 |
| JP | 2001-160572 A | 6/2001 |

OTHER PUBLICATIONS

Silversmith, William. "Countless—High Performance 2x Downsampling of Labeled Images Using Python and Numpy." Towards Data Science. Aug. 20, 2017. <https://towardsdatascience.com/countless-high-performance-2x-downsampling-of-labeled-images-using-python-and-numpy-e70ad3275589>. (Year: 2017).*
Nakazawa, Takeshi, and Deepak V. Kulkarni. "Wafer map defect pattern classification and image retrieval using convolutional neural network." IEEE Transactions on Semiconductor Manufacturing 31.2 (2018): 309-314. (Year: 2018).*
Zeiler, Matthew D., and Rob Fergus. "Visualizing and understanding convolutional networks." Computer Vision—ECCV 2014: 13th European Conference, Zurich, Switzerland, Sep. 6-12, 2014, Proceedings, Part I 13. Springer International Publishing, 2014. (Year: 2014).*
Kyeong, Kiryong, and Heeyoung Kim. "Classification of mixed-type defect patterns in wafer bin maps using convolutional neural networks." IEEE Transactions on Semiconductor Manufacturing 31.3 (2018): 395-402. (Year: 2018).*
PCT International Search Report and the Written Opinion dated Dec. 27, 2019, issued in related International Application No. PCT/CN2019/108058 (6 pages).

* cited by examiner

WAFER PROCESSING METHOD AND APPARATUS, STORAGE MEDIUM AND ELECTRONIC DEVICE

CROSS-REFERENCE TO RELATED APPLICATION

This application is a continuation application of International Patent Application No. PCT/CN2019/108058, filed on Sep. 26, 2019, which is based on and claims priority of Chinese Patent Application No. 201811149380.X, filed on Sep. 29, 2018 and entitled "WAFER PROCESSING METHOD AND APPARATUS, STORAGE MEDIUM AND ELECTRONIC DEVICE." The above-referenced application is incorporated herein by reference in their entirety.

TECHNICAL FIELD

This invention relates generally to the field of integrated circuits (ICs) manufacturing and, more specifically, a wafer processing method, a wafer processing apparatus, a storage medium and an electronic device.

BACKGROUND

The advancement in microelectronics technologies has created great opportunities for electronic devices such as mobile phones, computers, and tablets. With IC becoming increasingly complicated, more and more transistors need to be integrated into the IC, resulting in ever smaller transistors. With the length of the gate and the thickness of the oxide layer in a transistor approaching to theoretical physical limits, further development of two-dimensional ICs is becoming increasingly difficult.

Three-dimensional (3D) ICs have been developed to address the aforementioned issue. 3D IC is not constrained to a 2D layout, therefore it can be used in a much wider range of applications than 2D IC. A critical issue in designing and manufacturing 3D ICs is wafer stacking.

Conventionally, wafers to be stacked may go through a simple test to determine their properties, and then the wafers with similar properties are stacked together. However, existing methods for identifying wafers with similar properties are not accurate and require substantial manual intervention, which leads to intensive manual labor in the manufacturing process and low production yield. Therefore, a method that requires less human intervention and provides better production yield is desired.

It is to be noted that the above information disclosed in this Background section is only for facilitating the understanding of the background of this invention and therefore may contain information that does not form the prior art that is already known to a person of ordinary skill in the art.

SUMMARY

In view of the limitations of existing technologies described above, this disclosure provides a wafer processing method and apparatus, a storage medium and an electronic device that address the aforementioned limitations.

One aspect of this invention is directed to a wafer processing method. The method may include: partitioning a target wafer into one or more pre-divided area, with each pre-divided area having one or more dies; determining an area rating for each pre-divided area based on test data of the dies in each pre-divided area; feeding the area ratings to a trained classification model to determine a classification category of the target wafer.

In some embodiments, the method may further include identifying a second wafer having a same classification category as the target wafer; and stacking the target wafer with the second wafer.

In some embodiments, determining an area rating for each pre-divided area may include: obtaining the test data of the dies in each pre-divided area; determining a die rating for each die in each pre-divided area based on the test data of the dies in each pre-divided area; and determining the area rating for each pre-divided area based on the die ratings of the dies in each pre-divided area.

In some embodiments, the die ratings and the area ratings may use a same rating system.

In some embodiments, determining the area rating for each pre-divided area may include: counting the number of dies having the same die rating for each die rating in the pre-divided area; and designating the die rating with the largest number of dies as the area rating of the pre-divided area.

In some embodiments, the area ratings may be image features determined based on the test data of the dies in the pre-divided areas, and feeding the area ratings to a trained classification model may include: feeding the image features corresponding to the pre-divided areas to the trained classification model.

In some embodiments, the area ratings may be represented by colors.

In some embodiments, the aforementioned method may further include: determining a die rating for each die in each pre-divided area based on the test data of the dies in each pre-divided areas; determining the area rating for each pre-divided areas based on the die ratings of the dies in each pre-divided area; and determining the image feature corresponding to the area rating for each pre-divided area based on a predefined correspondence table.

In some embodiments, determining the area rating for each pre-divided area may include: counting the number of dies having the same die rating for each die rating in each pre-divided area; and designating the die rating with the largest number of dies as the area rating of the pre-divided area.

In the aforementioned embodiments, the classification model may be a convolutional neural network (CNN) including three convolutional pooling layers and three fully connected layers.

In some embodiments, the three convolutional pooling layers may be a first convolutional pooling layer, a second convolutional pooling layer and a third convolutional pooling layer, respectively, and each may include a convolutional layer and a max pooling layer. The first convolutional pooling layer may include 16 3×3 convolutional kernels, the second convolutional pooling layer may include 32 3×3 convolutional kernels, and the third convolutional pooling layer may include 64 3×3 convolutional kernels.

In some embodiments, the three fully connected layers may be a 256-dimensional first fully connected layer, a 256-dimensional second fully connected layer and a third fully connected layer, respectively. The third fully connected layer may be related to a category count.

Another aspect of this invention is directed to a storage medium. The storage medium may store a computer program. When the computer program is executed by a processor, the processor may perform the wafer processing method in any one of the aforementioned embodiments.

Another aspect of this invention is directed to an electronic device. The electronic device may include a processor and a memory for storing instructions executable by the processor. The process may be configured to perform the wafer processing method in any one of the aforementioned embodiments by executing the instructions.

Another aspect of this invention is directed to a wafer processing apparatus. The apparatus may include an area rating module, a wafer classification module.

The area rating module may be configured to determine an area rating for each of one or more pre-divided areas in a target wafer based on test data of dies in the target wafer. The wafer classification module may be configured to feed the area ratings to a trained classification model to determine a classification category of the target wafer.

In some embodiments, the apparatus may further include a wafer identification module and a wafer stacking module. The wafer identification module may be configured to identify a second wafer having a same classification category as the target wafer. The wafer stacking module may be configured to stack the target wafer with the second wafer.

In some embodiments, the area rating module may include a test data acquisition unit, a die rating determination unit and an area rating determination unit.

The test data acquisition unit may be configured to obtain the test data of the dies in each pre-divided area. The die rating determination unit may be configured to determine a die rating for each die in each pre-divided area based on the test data of the dies in each pre-divided area. The area rating determination unit may be configured to determine the area rating for each pre-divided area based on the die ratings of the dies in each pre-divided area.

In some embodiments, the area ratings may be image features determined based on the test data of the dies in the pre-divided areas. The wafer classification module may be configured to feed the image features corresponding to the pre-divided areas to the trained classification model to determine the classification category of the target wafer.

In some embodiments, the area ratings may be represented by colors.

In some embodiments, the area rating module may include a die rating determination unit, an area rating determination unit and an image feature determination unit.

The die rating determination unit may be configured to determine a die rating for each die in each pre-divided area based on the test data of the dies in each pre-divided area. The area rating determination unit may be configured to determine the area rating for each pre-divided area based on the ratings of the dies in each pre-divided area. The image feature determination unit may be configured to determine the image feature corresponding to the area rating for each pre-divided area based on a predefined correspondence table.

In some embodiments, the area rating determination unit may be further configured to count the number of dies having the same die ratings for each die rating in each pre-divided area, and to designate the die rating with the largest number of dies as the area rating of the pre-divided area.

In some embodiments, the classification model may be a convolutional neural network comprising three convolutional pooling layers and three fully connected layers.

In the wafer processing method of this invention, area ratings of pre-divided areas of a target wafer may be determined based on test data of dies in the target wafer and may be fed to a trained classification model to determine a classification category of the target wafer. Thus, wafers can be accurately classified so that similar wafers can be stacked together, thereby resulting in an increased production yield of integrated circuits (ICs).

It is to be understood that both the foregoing general description and the following detailed description are exemplary and explanatory only and are not restrictive of this invention.

BRIEF DESCRIPTION OF THE DRAWINGS

The accompanying drawings, which are incorporated in and constitute a part of the description, illustrate embodiments consistent with this invention and, together with the description, serve to explain the disclosed principles. It is apparent that these drawings present only some embodiments of this invention and those of ordinary skill in the art may obtain drawings of other embodiments from them without exerting any creative effort.

DETAILED DESCRIPTION OF THE EMBODIMENTS

Exemplary embodiments will now be described more fully with reference to the accompanying drawings. However, these exemplary embodiments can be implemented in many forms and should not be construed as being limited to those set forth herein. Rather, these embodiments are presented to provide a full and thorough understanding of this invention and to fully convey the concepts of the exemplary embodiments to others skilled in the art. In addition, the described features, structures, and characteristics may be combined in any suitable manner in one or more embodiments. In the following detailed description, many specific details are set forth to provide a more thorough understanding of this invention. However, those skilled in the art will recognize that the various embodiments can be practiced without one or more of the specific details or with other methods, components, materials, or the like. In some instances, well-known structures, materials, or operations are not shown or not described in detail to avoid obscuring aspects of the embodiments.

Further, the drawings are merely illustrative of this invention and are not necessarily drawn to scale. Throughout the drawing, like reference numbers indicate identical or similar elements, so any duplicate description of them will be omitted. The represented blocks in the drawing are purely functional entities, which do not necessarily correspond to physically separated entities. In other words, these functional entities may be implemented as software, or entirely or in part in one or more software-hardened modules, or in different networks and/or processor devices and/or microcontroller devices.

The flowcharts represented in the drawings are merely illustrative and do not necessarily include all shown steps. For example, some of these steps may be divided, while some can be at least partially combined. Therefore, the actual order in which they are performed may vary depending on the actual conditions.

This invention relates to a wafer processing method and apparatus, which can be implemented by a tester. In other words, the tester can perform the various steps in the wafer processing method detailed below, and the wafer processing apparatus of this invention can be incorporated in the tester. However, the method and apparatus of this invention may also be implemented by other devices having processing capabilities (e.g., a server), and this invention is not particularly limited in this regard.

Figure 1:
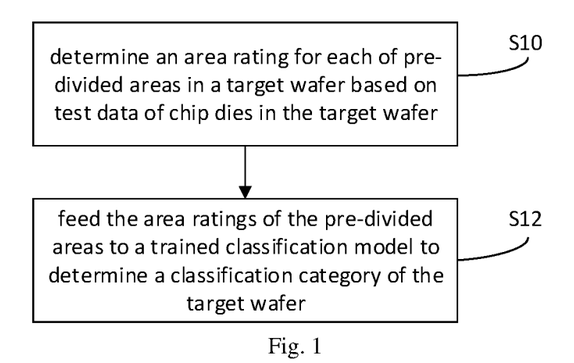
FIG. 1 is a flowchart of a wafer processing method in accordance with one embodiment of this invention.

FIG. 1 is a flowchart of a wafer processing method in accordance with one embodiment of this invention. As shown in FIG. 1, the wafer processing method may include the following steps S10 and S12.

In step S10, based on test data of dies in a target wafer, an area rating for each of pre-divided areas in the target wafer may be determined.

In some embodiments, the target wafer may be a wafer that has undergone a wafer test (WT) and a circuit/chip probe (CP) test and is waiting for classification. The size of the target wafer and type of devices formed on the target wafer may be determined based on actual requirements, and this invention is not limited in these regards.

The target wafer may contain a plurality of dies. At first, the tester may acquire the test data of the dies in the target wafer. The test data may be generated from a CP test performed by the tester on the target wafer, and may be, for example, test data generated from tests such as Basic IDD, IPP and IDDQ tests based on JEDEC SPEC or read/write functionality tests.

Next, the tester may analyze the test data using a predefined rating algorithm so as to determine die ratings of the dies. The predefined rating algorithm may be designed for the application where the dies are to be used. In one example, the CP test may include 10 test programs, each of which may be associated with a test threshold. For each of the dies, its results on the test programs may be compared with the respective test thresholds, and a die rating may be determined based on the number of test programs on which the die has passed. For example, if eight of the ten results meet the thresholds of the respective test programs, then the die can be given a die rating of "A"; and if there are only three satisfactory results, then the die may be given a die rating of "D". In addition, the test programs may each have an associated weight, and the die ratings of the dies can be determined based on the weights in combination with the test thresholds. In some embodiments, the die rating system may consist of, for example, the following five die ratings: "1", "A", "B", "C" and "D", with "1" representing the highest performance and "D" representing the lowest performance.

Figure 2:
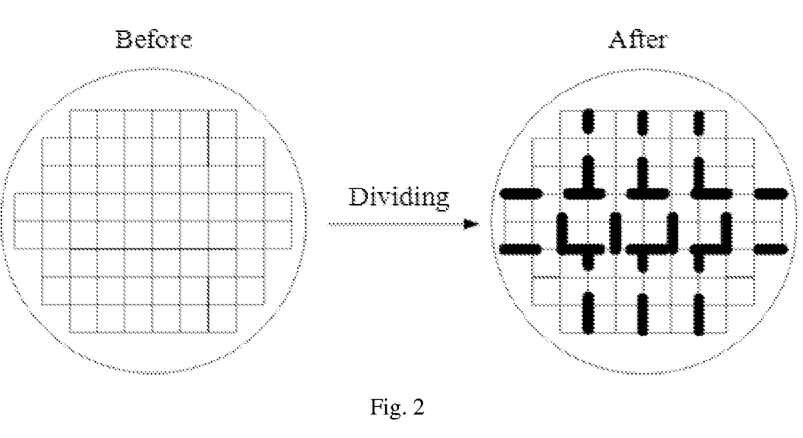
FIG. 2 is a schematic diagram illustrating pre-divided areas of a wafer in accordance with one embodiment of this invention.

The target wafer may be partitioned in advance into a number of areas, i.e., the target wafer may be partitioned into pre-divided areas, as shown in FIG. 2. Each pre-divided area may have one or more dies. It can be readily appreciated that the number of dies on the target wafer prior to the partitioning, as well as the number of pre-divided areas shown in FIG. 2 are illustrative only and may vary depending on different requirements. The pre-divided areas in the target wafer may be partitioned according to actual requirements and may have shapes or sizes different with those shown in FIG. 2. This invention is not limited in these regards.

The die ratings of the dies in the target wafer may be used to determine area ratings of the pre-divided areas. More specifically, for each of the pre-divided areas, the numbers of dies in that pre-divided area that have the same die rating may first be determined for each die rating, then the die rating that has the largest number of dies in the pre-divided area may be designated as an area rating of this pre-divided area.

Figure 3:
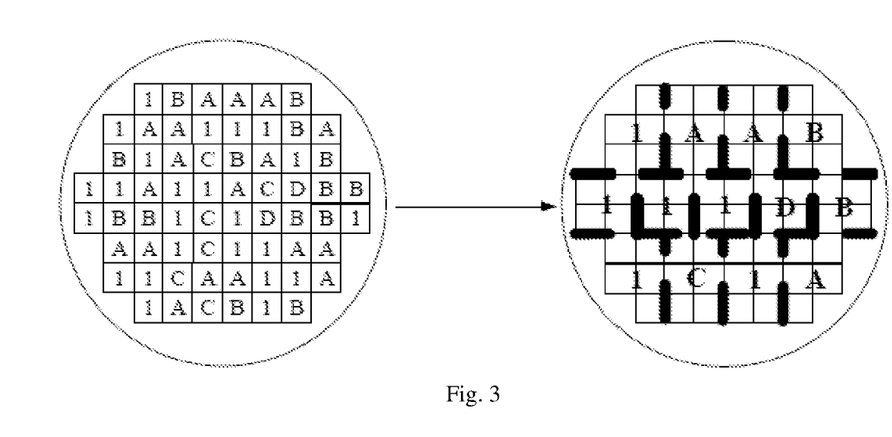
FIG. 3 is a schematic diagram illustrating a process to determine area ratings of the pre-divided areas based on die ratings in accordance with one embodiment of this invention.

FIG. 3 is a schematic diagram illustrating a process to determine area ratings of the pre-divided areas based on die ratings in accordance with one embodiment of this invention. Referring to FIG. 3, the area rating of each pre-divided area may be determined based on the die ratings of the dies in the pre-divided area. The area ratings and the die ratings may use a same rating system. That is, the area ratings and the die ratings may have the same group of rating labels (e.g., "1", "A", "B", "C" and "D"). For example, as shown in FIG. 3, the pre-divided area in the upper-left portion of a wafer may contain five dies, which have die ratings of "1", "1", "A", "B" and "1", respectively. Since "1" is the most frequent die rating of the dies in this pre-divided area (i.e., "1" is the die rating with the largest number of dies in this pre-divided area), the area rating of this pre-divided area can be designated as "1".

In step S12, the area ratings of the pre-divided areas of the target wafer may be fed to a trained classification model to determine a classification category of the target wafer.

In some embodiments, the classification model may be a convolutional neural network (CNN) model. The CNN model used in this application may provide good training and classification results for corresponding tasks. In this case, the CNN model may be trained in advance. More specifically, history test data from multiple wafers may first be obtained, and area ratings of pre-divided areas of these wafers may be determined. These area ratings may be used as an input to the CNN model. Next, classification categories of the wafers may be determined through manual analysis. Afterward, the manually determined classification categories and the area ratings of the pre-divided areas of the wafers may be used to train the CNN model by iteratively optimizing weights for convolutional kernels in the CNN model.

In addition, after a CNN model has been trained, a test set may be manually selected to test the trained CNN model to verify the accuracy of the CNN model.

Apart from the CNN model, other models, such as a machine learning model, may also be used to determine the classification category. This invention is not limited in this regard.

After a classification model is trained, the tester may input the area ratings of the pre-divided areas of the target wafer to the trained classification model and obtain a classification category of the target wafer based on an output of the model. The classification categories may include Category 1 (CAT1), Category 2 (CAT2), Category 3 (CAT3), etc., and this invention is not limited in this regard. Alternatively, the classification model may output probabilities for all possible categories, and the category with the highest probability may be chosen as the classification category for the target wafer.

In some embodiments, the method may further include, after the classification, stacking the target wafer with one or more wafers having the same classification category as the target wafer.

The tester may first identify one or more wafers having the same classification category as the target wafer. Then, the target wafer may be stacked with the identified one or more wafers. More specifically, the tester may send an instruction to a wafer stacking machine (e.g., a robotic arm), and the wafer stacking machine may respond to the instruction to accomplish the aforementioned wafer stacking task.

While the area ratings of the pre-divided areas have been denoted by symbols such as "1", "A", "B", "C" and "D", in the above embodiments, the area ratings may also be represented by image features including colors, shapes etc. determined based on the test data of the dies in the pre-divided areas. Another embodiment of this invention, in which the area ratings are represented by colors, are described in detail below.

In this embodiment, for each of the pre-divided areas on a target wafer, die ratings for the dies on the pre-divided areas may first be determined by a tester based on test data on the dies. The die ratings may be designated as, for example, "1", "A", "B", "C" or "D". The tester then may determine an area rating for each pre-divided area based on the die ratings of the dies in the pre-divided area. More specifically, the numbers of dies that have the same die ratings may be counted for each die rating, and the most frequent die rating (the die rating with the largest number of dies) may be designated as the area rating for the pre-divided area. Here, the area rating of the pre-divided area may also be designated as "1", "A", "B", "C" or "D". That is, the area ratings and the die ratings may use a same rating system.

Figure 4:
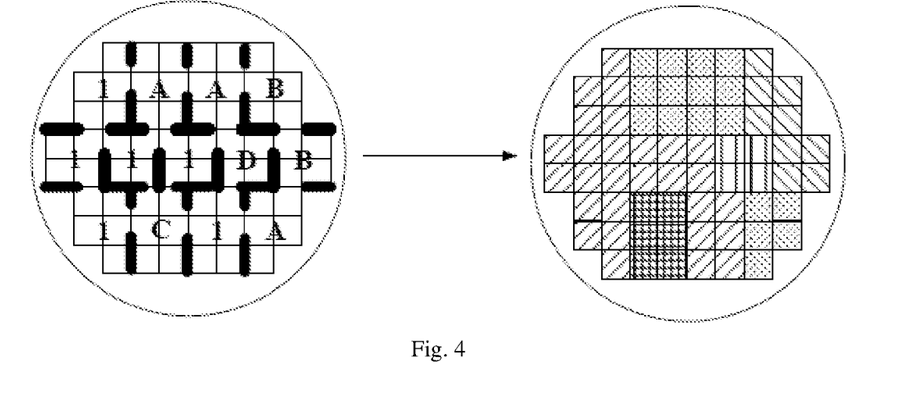
FIG. 4 is a schematic diagram illustrating a process to determine image features corresponding to the pre-divided areas based on the area ratings thereof in accordance with one embodiment of this invention.

After that, the tester may determine an image feature corresponding to the area rating for each pre-divided area based on a correspondence table. The correspondence table may be defined in advance by an operator to ensure that each of the area ratings corresponds to one unique image features. The image features may be colors. For example, the area rating of "1" may correspond to blue, the area rating of "A" may correspond to green, the area rating of "B" may correspond to red, the area rating of "C" may correspond to black, and the area rating of "D" may correspond to gray. As shown in FIG. 4, the different colors are indicated by different patterns for illustrative purpose.

Figure 5:
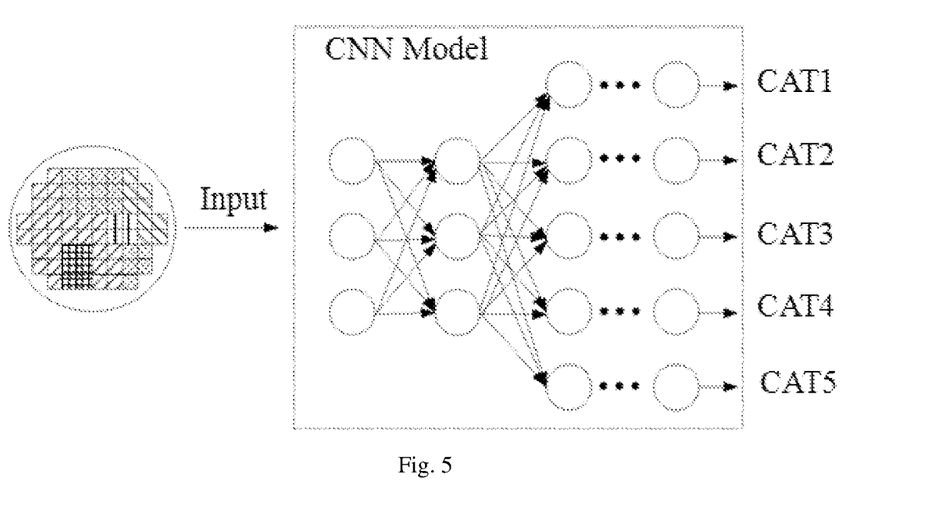
FIG. 5 is a schematic diagram illustrating a process to feed the image features for the pre-divided areas to a CNN model in accordance with one embodiment of this invention.

Referring to FIG. 5, after the image features of the pre-divided areas of the target wafer are determined, the image features may be fed to a CNN model to determine a classification category of the target wafer.

Figure 6:
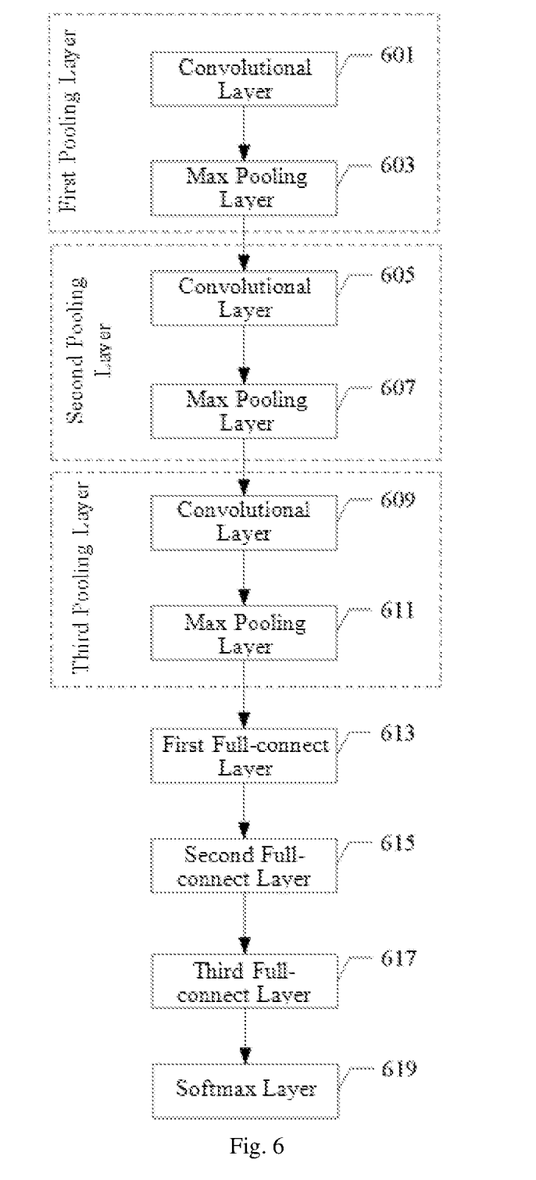
FIG. 6 is a schematic diagram illustrating an architecture of the CNN model in accordance with one embodiment of this invention.

FIG. 6 is a schematic diagram illustrating an architecture of the CNN model in accordance with one embodiment of this invention. As shown in FIG. 6, the CNN model may include three convolutional pooling layers, three fully connected layers and a softmax layer 619. The three convolutional pooling layers may be a first convolutional pooling layer, a second convolutional pooling layer and a third convolutional pooling layer, respectively, and each may include a convolutional layer and a max pooling layer.

More specifically, the first convolutional pooling layer may include a convolutional layer 601 and a max pooling layer 603, and the convolutional layer 601 may include 16 3×3 convolutional kernels. The second convolutional pooling layer may include a convolutional layer 605 and a max pooling layer 607, and the convolutional layer 605 may include 32 3×3 convolutional kernels. The third convolutional pooling layer may include a convolutional layer 609 and a max pooling layer 611, and the convolutional layer 609 may include 64 3×3 convolutional kernels. Each of the max pooling layers 603, 607 and 611 may have a size of 2×2 and may be used to reduce the feature dimension of an image.

The three fully connected layers may be a first fully connected layer 613, a second fully connected layer 615 and a third fully connected layer 617, respectively. The first fully connected layer 613 and the second fully connected layer 615 may be 256-dimensional, while the dimension of the third fully connected layer 617 may be related to a category count. For example, the dimension of the third fully connected layer 617 can be denoted as N. When the category count is 4, N may be 2, and when the category count is 8, N may be 3. In other words, N may be the smallest integer larger than or equal to the arithmetic square root of the category count.

In some embodiments, the CNN model in FIG. 6 may be optimized using Binary_crossentropy and RMSprop functions. Binary_crossentropy function may be a loss function for measuring the deviation between predicted values from the model and true values, which may serve as a basis for correcting weights and biases for the fully connected layers. RMSprop function may be configured to provide a scheme for updating the weights and biases.

Figure 7:
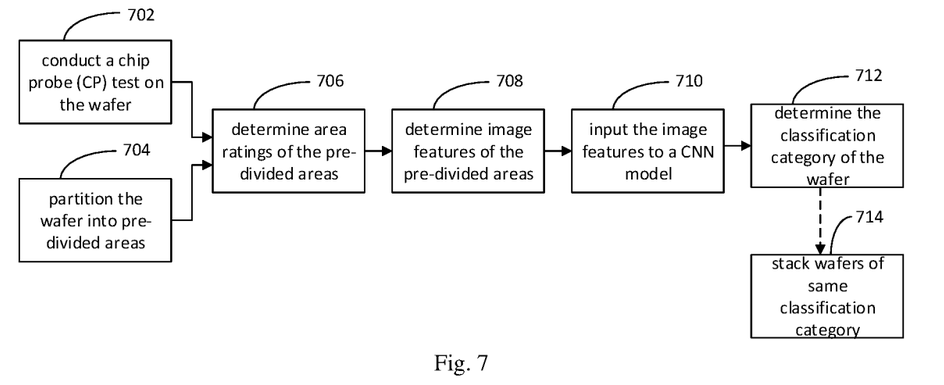
FIG. 7 is a schematic diagram illustrating a wafer processing method in accordance with one embodiment of this invention.

FIG. 7 is a schematic diagram illustrating a wafer processing method in accordance with one embodiment of this invention. The wafer processing method is described below with reference to FIG. 7.

The wafer processing method may include the following steps 702 through 712. In step 702, a chip probe (CP) test is conducted on a target wafer; in step 704, the target wafer may be partitioned into one or more pre-divided areas; in step 706, an area rating for each pre-divided area may be determined based on results of the CP test; in step 708, an image feature for each pre-divided area may be determined based on the corresponding area rating; in step 710, the image features may be fed into a CNN model; and in step 712, a classification category of the target wafer may be determined based on an output of the CNN model 712. Additionally, the method may further include step 714, in which wafers of same classification category may be stacked.

As described above, with the wafer processing method of this invention, wafers can be accurately classified so that similar wafers can be stacked together, thereby resulting in an increased production yield of ICs. Moreover, according to this invention, a CNN model may be used to automatically classify images representing a wafer, which further improves the accuracy of the classification.

It is to be noted that while the steps in the method of this invention are illustrated in a particular order in the accompanying drawings, this is not intended to require or imply that the steps must be performed in the order presented, or that the desired benefits can only be achieved when all the steps are performed. Additionally, or alternatively, one or more of the steps can be omitted, and/or some of them can be combined into a single step, and/or a certain step can be divided into multiple steps.

This invention further provides a wafer processing apparatus.

Figure 8:
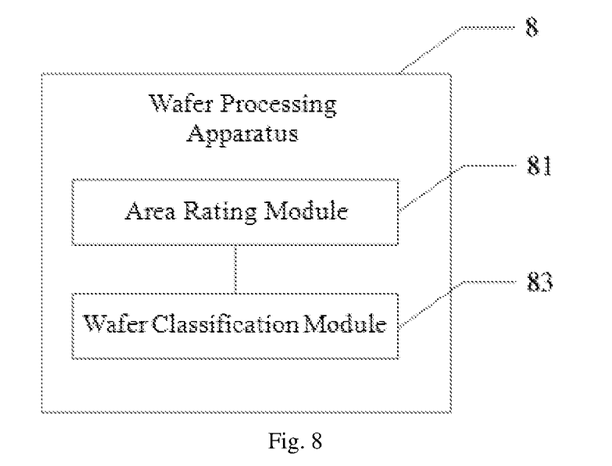
FIG. 8 is a block diagram of a wafer processing apparatus in accordance with one embodiment of this invention.

FIG. 8 is a block diagram of a wafer processing apparatus in accordance with one embodiment of this invention. Referring to FIG. 8, the wafer processing apparatus 8 may include an area rating module 81 and a wafer classification module 83.

The area rating module 81 may be configured to determine an area rating for each of one or more pre-divided areas of a target wafer based on test data of dies in the target wafer. The wafer classification module 83 may be configured to feed the area ratings to a trained classification model to determine a classification category of the target wafer.

Figure 9:
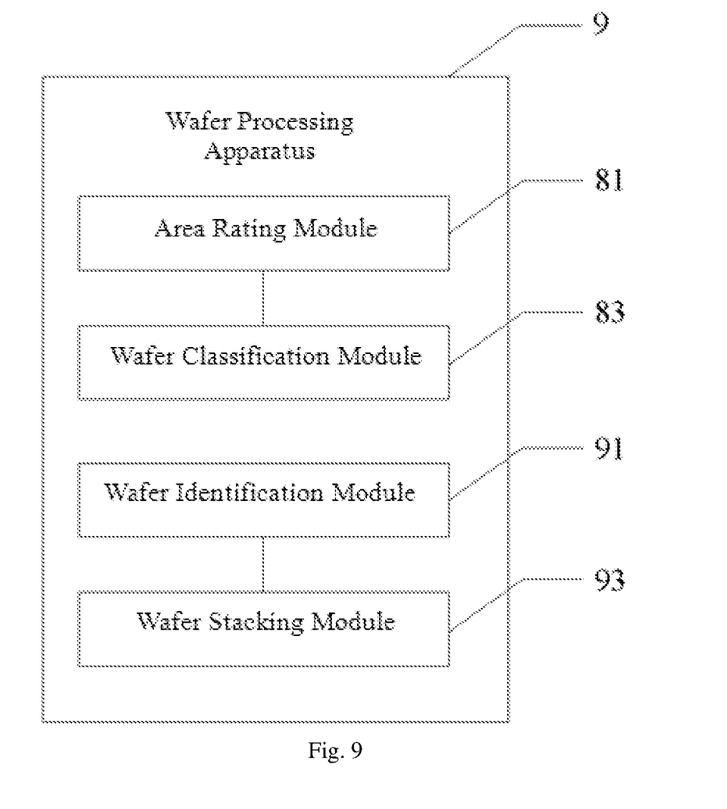
FIG. 9 is a block diagram of a wafer processing apparatus in accordance with another embodiment of this invention.

FIG. 9 is a block diagram of a wafer processing apparatus in accordance with another embodiment of this invention. Compared to the wafer processing apparatus 8 of FIG. 8, the wafer processing apparatus 9 of FIG. 9 may further include a wafer identification module 91 and a wafer stacking module 93, in addition to the area rating module 81 and the wafer classification module 83.

The wafer identification module 91 may be configured to identify a second wafer having a same classification category as the target wafer. The wafer stacking module 93 may be configured to stack the target wafer with the second wafer.

Figure 10:
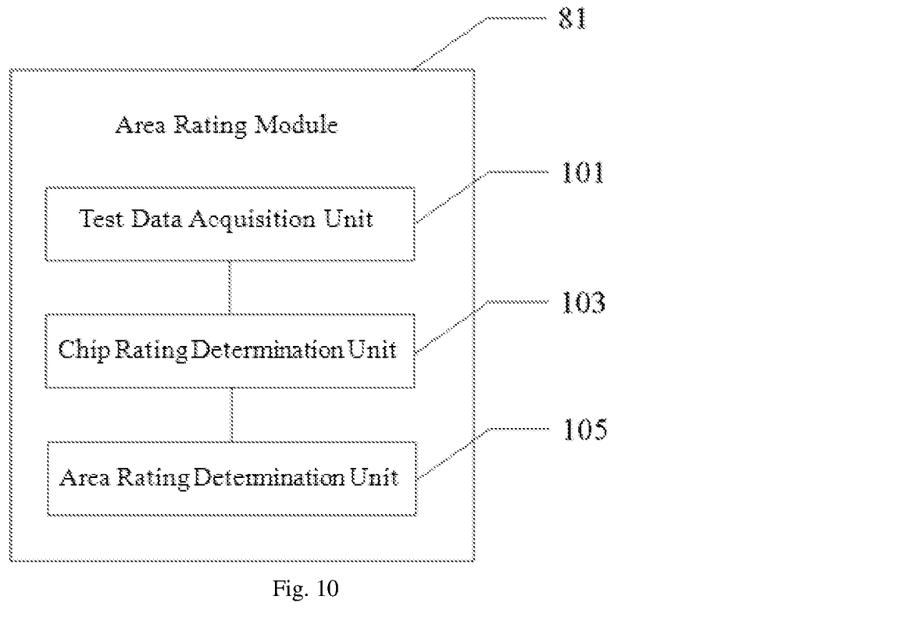
FIG. 10 is a block diagram of an area rating module in accordance with one embodiment of this invention.

In some embodiments, as shown in FIG. 10, the area rating module 81 may include a test data acquisition unit 101, a die rating determination unit 103 and an area rating determination unit 105.

The test data acquisition unit 101 may be configured to obtain test data of the dies in each pre-divided area. The die rating determination unit 103 may be configured to determine a die rating for each die in each pre-divided area based on the test data of the dies in each pre-divided area. The area rating determination unit 105 may be configured to determine the area rating for each pre-divided area based on the die ratings of the dies in each pre-divided area.

In some embodiments, the area rating determination unit 105 may be configured to count the numbers of dies having the same die rating for each die rating in each pre-divided area, and designate the die rating with the largest number of dies as the area rating of the pre-divided area.

In some embodiments, the area ratings may be represented by image features determined based on the test data of the dies in the pre-divided areas. The image features may be colors. The wafer classification module 83 may be configured to feed the image features corresponding the pre-divided areas of the target wafer to a trained classification model so as to determine the classification category of the target wafer.

Figure 11:
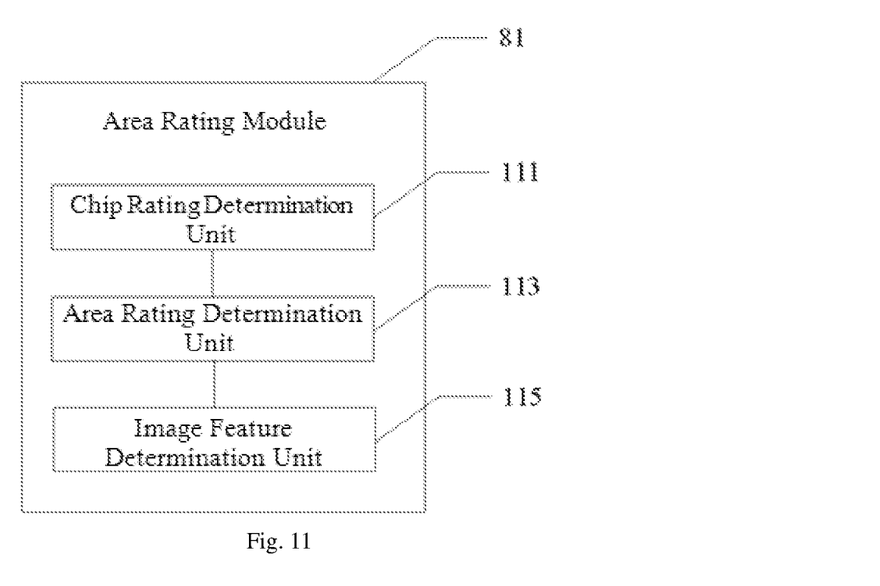
FIG. 11 is a block diagram of an area rating module in accordance with one embodiment of this invention.

FIG. 11 is a block diagram of an area rating module in accordance with one embodiment of this invention. As shown in FIG. 11, the area rating module 81 may include a die rating determination unit 111, an area rating determination unit 113 and an image feature determination unit 115.

The die rating determination unit 111 may be configured to determine a die rating for each die in each pre-divided area based on the test data of the dies in each pre-divided area. The area rating determination unit 113 may be configured to determine the area rating for each pre-divided area based on the die ratings of the dies in each pre-divided area.

The image feature determination unit 115 may be configured to determine image feature corresponding to the area rating for each pre-divided area based on a predefined correspondence table.

In some embodiments, the area rating determination unit 113 may be configured to count the numbers of dies having the same die rating for each die rating in each pre-divided area, and designate the die rating with the largest number of dies as the area rating of the pre-divided area.

In some embodiments, the classification model may be a convolutional neural network (CNN) model including three convolutional pooling layers and three fully connected layers.

In some embodiments, the three convolutional pooling layers may be a first convolutional pooling layer, a second convolutional pooling layer and a third convolutional pooling layer, respectively, and each may include a convolutional layer and a max pooling layer. The first convolutional pooling layer may include 16 3×3 convolutional kernels, the second convolutional pooling layer may include 32 3×3 convolutional kernels, and the third convolutional pooling layers may include 64 3×3 convolutional kernels.

In some embodiments, the three fully connected layers may be a 256-dimensional first fully connected layer, a 256-dimensional second fully connected layer and a third fully connected layer, respectively. The third fully connected layer may be related to a category count.

With the wafer processing apparatus in accordance with the aforementioned embodiments of this invention, wafers can be accurately classified so that similar wafers can be stacked together, thus resulting in an increased production yield of ICs. Moreover, according to this invention, a CNN model can be used to automatically classify images representing a wafer, which further improves the accuracy of the classification.

Various modules of the wafer processing apparatus of this invention are the same as corresponding counterparts described in the aforementioned embodiments for the wafer processing method, these modules therefore will not be repeatedly described in detail herein for the sake of conciseness.

This invention further provides a computer-readable storage medium storing thereon a program product capable of implementing the method as defined hereinabove. In some embodiments, various aspects of this invention may also be implemented in the form of a program product including program code for causing a terminal device, on which the program product is running, to perform the operations according to the various embodiments described hereinabove.

Figure 12:
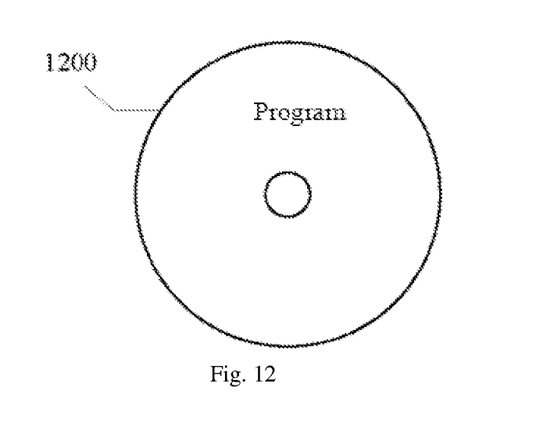
FIG. 12 is a schematic diagram illustrating a storage medium in accordance with one embodiment of this invention.

FIG. 12 is a schematic diagram illustrating a program product 1200 for implementing the aforementioned methods in accordance with one embodiment of this invention. As shown in FIG. 12, the program product 1200 may be provided as a portable compact disk read only memory (CD-ROM) containing program code that can be run on a terminal device such a personal computer (PC). However, the program product of this invention is not limited thereto, as the readable storage medium herein may be any tangible medium that can contain or store a program for use by or in connection with an instruction execution system, apparatus, or device.

The program product may be implemented as any combination of one or more readable media each in the form of a readable signal medium or a readable storage medium. The readable storage medium may be, for example, but is not limited to, an electronic, magnetic, optical, electromagnetic, infrared, or semiconductor system, apparatus, or device, or any suitable combination of the foregoing. More specific examples (a non-exhaustive list) of the readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a CD-ROM, an optical storage device, a magnetic storage device, or any suitable combination of the foregoing.

The computer-readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. The readable signal medium may also be any readable medium that is not a readable storage medium and that can communicate, propagate, or transport a program for use by or in connection with an instruction execution system, apparatus, or device.

Program code embodied on the computer readable medium may be transmitted using any appropriate medium, including but not limited to wireless, wireline, optical fiber cable, RF, etc., or any suitable combination of the foregoing.

Program code for carrying out operations of this invention may be written in any combination of one or more programming languages, including an object-oriented programming language such as Java, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on a remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

This invention further provides an electronic device capable of implementing any one of the aforementioned methods.

As will be appreciated by one skilled in the art, aspects of this invention may be embodied as a system, method or program product. Accordingly, aspects of this invention may take the form of an entirely hardware embodiment, an entirely software embodiment (including firmware, microcode, etc.) or an embodiment combining software and hardware aspects that may all generally be referred to herein as a "circuit," "module" or "system."

Figure 13:
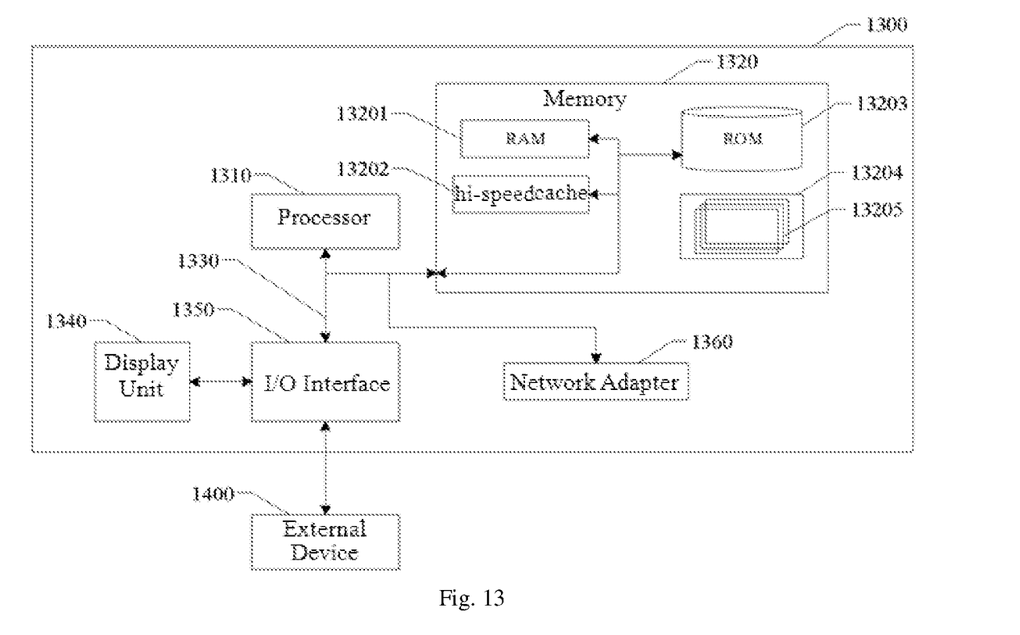
FIG. 13 is a block diagram of an electronic device in accordance with one embodiment of this invention.

FIG. 13 is a block diagram of an electronic device in accordance with one embodiment of this invention. The electronic device 1300 according to such embodiments of this invention will be described below with reference to FIG. 13. The electronic device 1300 shown in FIG. 13 is only one example of a suitable computer system and is not intended to suggest any limitation as to the scope of use or functionality of embodiments of the invention described herein.

As shown in FIG. 13, the electronic device 1300 may be implemented as a general-purpose computing device. The components of the electronic device 1300 may include, but are not limited to, one or more aforementioned processors 1310, at least one aforementioned memory 1320, a bus 1330 that couples various system components (including the memory 1320 to the processors 1310) and a display unit 1340.

The memory may store thereon program code that can be executed by the processors 1310 to cause the processors 1310 to perform the steps according to the various embodiments described hereinabove. For example, the processors 1310 may perform steps S10 to S12 shown in FIG. 1.

The memory 1320 may include a readable medium in the form of a volatile memory, such as a random-access memory (RAM) 13201 and/or a high-speed cache memory 13202, as well as a read only memory (ROM) 13203.

The memory 1320 may further include a program/utility 13204 having a set (at least one) of program modules 13205. Such program modules 13205 may include, but are not limited to an operating system, one or more application programs, other program modules and program data. Each of the operating system, one or more application programs, other program modules, and program data or some combination thereof, may include an implementation of a networking environment.

The bus 1330 may represent one or more of any of several types of bus structures, including a memory bus or memory controller, a peripheral bus, an accelerated graphics port, and a processor or local bus using any of a variety of bus architectures.

The electronic device 1300 may also communicate with one or more external devices 1400 (e.g., a keyboard, a pointing device, a Bluetooth device, etc.), one or more devices that enable a user to interact with the electronic device 1300 and/or any devices (e.g., router, modem, etc.) that enable the electronic device 1300 to communicate with one or more other general-purpose computing devices. Such communication can occur via input/output (I/O) interfaces 1350. The electronic device 1300 may communicate with one or more networks (e.g., a local area network (LAN), a general wide area network (WAN), and/or a public network such as the Internet) via a network adapter 1360. The network adapter 1360 may communicate with the other components of the electronic device 1300 via the bus 1330. It should be understood that, although not shown, other hardware and/or software components could be used in conjunction with the electronic device 1300. Examples include, but are not limited to: microcode, device drivers, redundant processing units, external disk drive arrays, RAID systems, tape drives, and data archival storage systems, etc.

From the description of the above embodiments, it will be readily appreciated by those skilled in the art that the exemplary embodiment disclosed herein may be implemented either by software or by software in combination with necessary hardware. Therefore, the embodiments of this invention can be embodied in a software product which may be stored in a non-volatile storage medium (e.g., a CD-ROM, USB flash drive, portable hard drive, etc.) or in a network and may include a number of instructions for causing a computing device (e.g., a PC, server, touch terminal, network device, etc.) to implement the method of this invention.

The accompanying drawings are merely illustrative of a series of processes included in the method according to some embodiments of this invention and are not intended to be limiting. It will be readily appreciated that the way in which the processes are illustrated does not indicate any chronological order of them or limit them to a particular chronological order. Furthermore, it will also be readily appreciated that the processes may be performed, for example, synchronously or asynchronously in multiple modules.

It should be noted that although several modules or units of devices for tacking actions have been mentioned in the detailed description above, such division is not mandatory. Indeed, in accordance with embodiments of this invention, the features and functions of two or more modules or units described above may be embodied in one module or unit. Conversely, the features and functions of one of the modules or units described above may be further divided into multiple modules or units.

Other embodiments of this invention will be apparent to those skilled in the art from considering the specification and practicing the embodiments disclosed herein. Accordingly, this disclosure is intended to cover all and any variations, uses, or adaptations of this invention which follow, in general, the principles thereof and include such departures from this invention as come within common knowledge or customary practice within the art to which this invention pertains. It is also intended that the specification and examples be considered as exemplary only, with true scope and spirit of this invention being indicated by the appended claims.

It is to be understood that this invention is not limited to the exact structures as described above and illustrated in the drawings and may be modified or changed without departing from its scope. The scope of this invention is intended to be defined only by the appended claims.

The invention claimed is:

1. A wafer processing method, comprising:
 partitioning a target wafer into one or more pre-divided areas, each pre-divided area having a plurality of dies;
 determining, based on test data of the dies in each pre-divided area, an area rating for each pre-divided area; and
 feeding the area ratings to a trained classification model to determine a classification category of the target wafer,
 wherein determining an area rating for each pre-divided area comprises:
  obtaining the test data of the dies in each pre-divided area;
  determining, based on the test data of the dies in each pre-divided area, a die rating for each die in each pre-divided area; and
  determining, based on the die ratings of the dies in each pre-divided area, the area rating for each pre-divided area; and
 wherein determining the area rating for each pre-divided area comprises:
  counting, in each pre-divided area, a number of dies having the same die rating for each die rating; and
  designating the die rating with a largest number of dies as the area rating of the pre-divided area.

2. The method of claim 1, further comprising:
 identifying a second wafer having a same classification category as the target wafer; and
 stacking the target wafer with the second wafer.

3. The method of claim 1, wherein the die ratings and the area ratings use a same rating system.

4. The method of claim 1, wherein the area ratings are image features determined based on the test data of the dies in the pre-divided areas, and
 wherein feeding the area ratings to the trained classification model comprises:
  feeding the image features corresponding to the pre-divided areas to the trained classification model.

5. The method of claim 4, wherein the area ratings are represented by colors.

6. The method of claim 4, further comprising:
 determining, based on the test data of the dies in each pre-divided area, a die rating for each die in each pre-divided area;
 determining, based on the die ratings of the dies in each pre-divided area, the area rating for each pre-divided area; and
 determining, based on a predefined correspondence table, the image feature corresponding to the area rating for each pre-divided area.

7. The method of claim 6, wherein determining the area rating for each pre-divided area comprises:
 counting, in each pre-divided area, a number of dies having the same die rating for each die rating; and
 designating the die rating with the largest number of dies as the area rating of the pre-divided area.

8. The method of claim 4, wherein the classification model is a convolutional neural network comprising three convolutional pooling layers and three fully connected layers.

9. The method of claim 8, wherein the three convolutional pooling layers are a first convolutional pooling layer, a second convolutional pooling layer and a third convolutional pooling layer, and each of the three convolutional pooling layers comprises a convolutional layer and a max pooling layer, and
 wherein the first convolutional pooling layer comprises 16 3×3 convolutional kernels, the second convolutional pooling layer comprises 32 3×3 convolutional kernels, the third convolutional pooling layer comprises 64 3×3 convolutional kernels.

10. The method of claim 8, wherein the three fully connected layers are a 256-dimensional first fully connected layer, a 256-dimensional second fully connected layer, and a third fully connected layer related to a category count, respectively.

11. A non-transitory storage medium, storing thereon a computer program, wherein when the computer program is executed by a processor, the processor performs the method of claim 1.

12. An electronic device, comprising:
 a processor; and
 a memory for storing instructions executable by the processor,
 wherein the processor is configured to execute the instructions to perform operations comprising:
 partitioning a target wafer into one or more pre-divided areas, each pre-divided area having a plurality of dies;
 determining, based on test data of the dies in each pre-divided area, an area rating for each pre-divided area; and
 feeding the area ratings to a trained classification model to determine a classification category of the target wafer,
 wherein determining an area rating for each pre-divided area comprises:
  obtaining the test data of the dies in each pre-divided area;
  determining, based on the test data of the dies in each pre-divided area, a die rating for each die in each pre-divided area; and
  determining, based on the die ratings of the dies in each pre-divided area, the area rating for each pre-divided area; and wherein determining the area rating for each pre-divided area comprises:
  counting, in each pre-divided area, a number of dies having the same die rating for each die rating; and
  designating the die rating with a largest number of dies as the area rating of the pre-divided area.

13. The electronic device of claim 12, wherein the operations further comprise:
  identifying a second wafer having a same classification category as the target wafer; and
  stacking the target wafer with the second wafer.

14. The electronic device of claim 12, wherein the die ratings and the area ratings use a same rating system.

15. The electronic device of claim 12, wherein the area ratings are image features determined based on the test data of the dies in the pre-divided areas, and
  wherein feeding the area ratings to the trained classification model comprises:
    feeding the image features corresponding to the pre-divided areas to the trained classification model.

16. The electronic device of claim 15, wherein the area ratings are represented by colors.

17. The electronic device of claim 15, wherein the operations further comprise:
  determining, based on the test data of the dies in each pre-divided area, a die rating for each die in each pre-divided area;
  determining, based on the die ratings of the dies in each pre-divided area, the area rating for each pre-divided area; and
  determining, based on a predefined correspondence table, the image feature corresponding to the area rating for each pre-divided area.

18. The electronic device of claim 17, wherein determining the area rating for each pre-divided area comprises:
  counting, in each pre-divided area, a number of dies having the same die rating for each die rating; and
  designating the die rating with the largest number of dies as the area rating of the pre-divided area.

19. The electronic device of claim 15, wherein the classification model is a convolutional neural network comprising three convolutional pooling layers and three fully connected layers.

20. The electronic device of claim 19, wherein the three convolutional pooling layers are a first convolutional pooling layer, a second convolutional pooling layer and a third convolutional pooling layer, and each of the three convolutional pooling layers comprises a convolutional layer and a max pooling layer, and
  wherein the first convolutional pooling layer comprises 16 3×3 convolutional kernels, the second convolutional pooling layer comprises 32 3×3 convolutional kernels, the third convolutional pooling layer comprises 64 3×3 convolutional kernels.

* * * * *